United States Patent
Butters

(10) Patent No.: US 12,000,911 B2
(45) Date of Patent: Jun. 4, 2024

(54) SYSTEM AND METHOD FOR TIME-MULTIPLEXED DUAL ATOMIC MAGNETOMETRY

(71) Applicant: NEARFIELD ATOMICS, INC., Seattle, WA (US)

(72) Inventor: John Butters, Seattle, WA (US)

(73) Assignee: NEARFIELD ATOMICS, INC.

( * ) Notice: Subject to any disclaimer, the term of this patent is extended or adjusted under 35 U.S.C. 154(b) by 9 days.

(21) Appl. No.: 18/128,778

(22) Filed: Mar. 30, 2023

(65) Prior Publication Data

US 2023/0236270 A1 Jul. 27, 2023

Related U.S. Application Data

(60) Division of application No. 17/655,654, filed on Mar. 21, 2022, now Pat. No. 11,639,976, which is a continuation of application No. 17/386,081, filed on Jul. 27, 2021, now Pat. No. 11,287,494.

(60) Provisional application No. 63/057,815, filed on Jul. 28, 2020.

(51) Int. Cl.
  *G01R 33/26* (2006.01)
  *G01R 33/032* (2006.01)

(52) U.S. Cl.
  CPC ........... *G01R 33/26* (2013.01); *G01R 33/032* (2013.01)

(58) Field of Classification Search
  CPC ..... G01N 37/005; G01R 33/032; G01R 33/26
  See application file for complete search history.

(56) References Cited

U.S. PATENT DOCUMENTS

| | | | |
|---|---|---|---|
| 9,995,800 B1 | 6/2018 | Schwindt et al. | |
| 10,613,163 B1 | 4/2020 | Savukov et al. | |
| 2011/0193555 A1* | 8/2011 | Sugioka | G01R 33/032 324/244.1 |
| 2014/0240710 A1* | 8/2014 | Shigekawa | G01N 21/636 356/445 |
| 2014/0354275 A1* | 12/2014 | Sheng | G01R 33/26 324/244.1 |

(Continued)

OTHER PUBLICATIONS

PCT Application No. PCT/US2021/043399, International Search Report and Written Opinion, dated Oct. 26, 2021, 8 pages.

(Continued)

*Primary Examiner* — Jay Patidar
(74) *Attorney, Agent, or Firm* — COZEN O'CONNOR

(57) ABSTRACT

A time-multiplexed dual atomic magnetometer includes first and second vapor cells such that an external magnetic field induces Larmor precession of atoms within the vapor cells. The magnetometer includes first and second polarimeters for measuring first and second polarizations of first and second probe beams that propagate through the first and second vapor cells, respectively. The magnetometer includes a controller that gates the probe beams such that (i) the first probe beam propagates through the first vapor cell during a first measurement stage, (ii) the second probe beam does not propagate through the second vapor cell during the first measurement stage, (iii) the second probe beam propagates through the second vapor cell during a second measurement stage that begins when the first measurement stage ends, and (iv) the first probe beam does not propagate through the first vapor cell during the second measurement stage.

20 Claims, 7 Drawing Sheets

(56) References Cited

U.S. PATENT DOCUMENTS

| | | |
|---|---|---|
| 2016/0061913 A1 | 3/2016 | Kobayashi et al. |
| 2018/0238974 A1 | 8/2018 | Shah et al. |
| 2018/0306876 A1 | 10/2018 | Parsa et al. |
| 2020/0103475 A1 | 4/2020 | Kim et al. |
| 2021/0109173 A1* | 4/2021 | Lee .................. G01R 33/26 |

OTHER PUBLICATIONS

Hunter, et al., Free-induction-decay Magnetometer Based on a Microfabricated Cs Vapor Cell, dated May 23, 2018, pp. 1-10.
Jimenez-Martinez, et al., High-Bandwidth Optical Magnetometer, J. Opt. Soc. Am. B vol. 29, No. 12, dated Dec. 2012, pp. 3398-3403.
Grujic et al., A Sensitive and Accurate Atomic Magnetometer Based on Free Spin Precession, Eur. Phys. J. D, 2015, 39: 135, pp. 1-10.
Hunter et al., Waveform Reconstruction with a Cs Based Free-Induction-Decay Magnetometer, Optics Express, 30531 KA. 26, No. 23, dated Nov. 12, 2018, 9 pages.
Wilson, et al., Wide-Bandwidth Atomic Magnetometry via Instantaneous-Phase Retrieval, arXiv:2003.04526v1, physics.atom-ph, dated Mar. 10, 2020, pp. 1-10.

* cited by examiner

SYSTEM AND METHOD FOR TIME-MULTIPLEXED DUAL ATOMIC MAGNETOMETRY

RELATED APPLICATIONS

This application is a divisional of U.S. patent application Ser. No. 17/655,654, filed on Mar. 21, 2022, which is a continuation of U.S. patent application Ser. No. 17/386,081, filed on Jul. 27, 2021 and now U.S. Pat. No. 11,287,494, which claims priority to U.S. Provisional Patent Application No. 63/057,815, filed on Jul. 28, 2020 and titled "Time-Multiplexed Dual Magnetometry." Each of these applications is incorporated herein by reference in its entirety.

BACKGROUND

In atom magnetometry, spin-polarized atoms in an external magnetic field precess at the Larmor frequency. This precession is typically measured via Faraday rotation, i.e., the spin-polarized atoms rotate the linear polarization of a weak laser beam that passes through the atoms. This rotation of the laser polarization can be detected with a polarimeter, and the resulting electronic signal can be processed into a value of the external magnetic field. Since the gyromagnetic ratio of the atoms (i.e., the Larmor frequency per unit magnetic-field strength) is determined primarily by the energy-level structure of the atoms, atomic magnetometry benefits from high accuracy, as compared to other forms of magnetometry (e.g., SQUID, fluxgate, Hall effect, magnetoresistance, etc.).

In addition, recent advances in the development of millimeter-size vapor cells has enabled the placement of atom-vapor-based magnetometer heads close to the sample to be measured (e.g., within one centimeter of the sample). This improves sensitivity since the magnetic field strength generated by a sample drops at least as $1/r$, where r is the distance between the sample and the magnetometer head. In some cases (e.g., a magnetic dipole), the magnetic field drops as rapidly as $1/r^3$, further emphasizing the need to miniaturize sensor heads so that they can be placed closer to the sample.

SUMMARY

An atomic magnetometer is typically operated in an alternating sequence of pumping and probing stages. In each pumping stage, a pump laser beam is directed through a vapor cell to spin-polarize gaseous atoms therein. An external magnetic field may be applied to establish a quantization axis. The polarization (e.g., circular or linear), propagation direction, and modulation (e.g., AM or FM) of the pump laser beam is selected such that the optical pumping results in a ground-state coherence (i.e., a coherence between two or more magnetic ground-state sublevels of the atoms). During the probing stage, a linear polarized probe laser beam passes through the vapor cell. The spin-polarized atoms rotate the polarization of the probe laser beam synchronously with the Larmor precession. The rotated polarization is then measured with a polarimeter.

The duration of each probing stage is limited by a dephasing time of the atoms (i.e., the transverse spin relaxation time $T_2$). Specifically, collisions between atoms disrupt the ground-state coherences, washing out the Larmor precession, and hence the measured signal. Although techniques exist for increasing the dephasing time (e.g., spin-relaxation coatings and buffer gasses), dephasing times are still typically on the order of milliseconds. Furthermore, as the size of the vapor cell decreases, the rate of collisions between the atoms and the walls increases, leading to shorter dephasing times (even if the walls have a spin-relaxation coating).

The duration of each pumping stage is typically between a few hundred microseconds and a few milliseconds, depending on the available power of the pump laser beam and the transition strengths of the atomic species used. Thus, for each cycle of one pumping stage followed by one probing stage, the atoms may be measured for as little as 50% of the time. That is, half of the time is wasted preparing the atoms, which limits the signal-to-noise ratio (SNR). Gaps in the measured time record of the atoms can also introduce aliasing and other deleterious signal-processing artifacts that mask the true magnetic signal to be measured.

To solve these problems, the present embodiments feature systems and methods for time-multiplexed atomic magnetometry performed with two vapor cells located adjacent to (e.g., on opposite sides of) the sample to be measured. The first vapor cell is operated according to a first sequence of alternating pumping and probing stages. Similarly, the second vapor cell is operated according to a second sequence of alternating pumping and probing stages. However, the second sequence is delayed relative to the first sequence such that the second vapor cell is pumped while the first vapor cell is probed, and the first vapor cell is pumped while the second vapor cell is probed. With this time-multiplexed operation, the magnetic field generated by the sample can be measured without any time gaps. More specifically, and as described in more detail below, the signals from the two vapor cells can be interleaved to form a single gapless time sequence that represents the time-varying magnetic field generated by the sample over the entire time sequence.

By using two vapor cells, the present embodiments advantageously have twice the signal-to-noise ratio of conventional atomic magnetometers that use only one vapor cell (assuming equal vapor pressures, vapor cell sizes, atomic species, etc.). However, the present embodiments also offer advantages over simply doubling the size or pressure of one vapor cell. For example, doubling the vapor cell size results in the extra atoms being located farther from the sample, where they are less sensitive to the magnetic field. As a result, doubling the vapor cell size does not necessarily double the SNR. On the other hand, in the present embodiments the two vapor cells may be located on opposite sides of the sample, in which case both vapor cells are located proximate to the sample, ensuring equal sensitivity to the magnetic field. Increasing the vapor pressure inside the cell can help, although the resulting pressure broadening can reduce $T_2$. More than two vapor cells can be used to achieve even greater increases in signal-to-noise ratio.

In embodiments, a time-multiplexed dual atomic magnetometer operates as a pair of free-induction-decay atomic magnetometers. In these embodiments, the signal from each of the two vapor cells is continuously recorded over several oscillations. For a single probing stage, the resulting signal is approximately equal to an exponentially decaying sinusoid, which can be fitted to extract a center frequency which equals the average Larmor frequency over the probing phase. The Larmor frequency may then be converted into a corresponding value of the magnetic field. Repeating this process over several consecutive cycles produces a time sequence of magnetic field values. The bandwidth of this approach is limited by the duration of one cycle. However, the sequence can be used to identify low-frequency components spanning over several cycles.

To increase the bandwidth, instantaneous-phase retrieval may be implemented on the recorded signals. This technique was recently demonstrated for atomic magnetometers in "Wide-bandwidth atomic magnetometry via instantaneous-phase retrieval" by N. Wilson et al. (arXiv:2003.04526v1), although it has been used in geosciences for several decades. For example, see "The calculation of instantaneous frequency and instantaneous bandwidth" by A. E. Barnes (Geophysics 57, 1520-1539, 1992). In addition to these references, details about instantaneous phase and frequency can be found in "Estimating and interpreting the instantaneous frequency of a signal. I. Fundamentals" by B. Boashash (Proc. IEEE 80, 520-538, 1992). With instantaneous-phase retrieval, the present embodiments are expected to operate at bandwidths exceeding 10 KHz.

The present embodiments may be used to enhance magnetometry in a host of applications, including geosciences, magnetic communication, threat detection, the measurement of bio-magnetic signals (e.g., magnetoencephalography), nuclear magnetic resonance (NMR), and magnetic resonance imaging (MRI). In another application, the present embodiments are used to measure the time-varying magnetic field generated by molecules in an aqueous solution. It is hypothesized that the motion of these molecules (e.g., stretching, rotating, translating, etc.) causes electric charges therein to accelerate, which produces magnetic fields at the femtotesla level. When the time-varying magnetic field is later "played" to cells (e.g., by applying electric currents to coils to replicate the time-varying magnetic field), the cells may behave as if the original molecules were present. In this regard, the time-varying magnetic field may be used to replicate the pharmacological effects of a compound on the cells, but without physically exposing the cells to the actual compound. As such, the present embodiments may be used to identify new therapies for treating cancer. Examples of molecules whose time-varying magnetic fields can be measured and subsequently used for such therapeutic purposes include small interfering RNA (siRNA) and messenger RNA (mRNA) from genes.

In embodiments, a time-multiplexed dual atomic magnetometer includes first and second vapor cells positioned such that an external magnetic field induces Larmor precession of atoms confined within the first and second vapor cells. The dual atomic magnetometer also includes a first polarimeter configured to measure a first polarization of a first probe beam after the first probe beam propagates through the first vapor cell. The dual atomic magnetometer also includes a second polarimeter configured to measure a second polarization of a second probe beam after the second probe beam propagates through the second vapor cell. The time-multiplexed dual atomic magnetometer also includes a controller configured to gate the first and second probe beams such that: the first probe beam propagates through the first vapor cell during a first measurement stage, the first measurement stage beginning when a second measurement stage ends, the second measurement stage beginning when the first measurement stage ends; the second probe beam does not propagate through the second vapor cell during the first measurement stage; the second probe beam propagates through the second vapor cell during the second measurement stage; and the first probe beam does not propagate through the first vapor cell during the second measurement stage.

In other embodiments, a method for time-multiplexed dual atomic magnetometry includes inducing, with an external magnetic field, Larmor precession of atoms that are confined within first and second vapor cells. The method also includes measuring, with a first polarimeter, a first polarization of a first probe beam after the first probe beam propagates through the first vapor cell. The method also includes measuring, with a second polarimeter, a second polarization of a second probe beam after the second probe beam propagates through the second vapor cell. The method also includes gate the first and second probe beams such that: the first probe beam propagates through the first vapor cell during a first measurement stage, the first measurement stage beginning when a second measurement stage ends, the second measurement stage beginning when the first measurement stage ends; the second probe beam does not propagate through the second vapor cell during the first measurement stage; the second probe beam propagates through the second vapor cell during the second measurement stage; and the first probe beam does not propagate through the first vapor cell during the second measurement stage.

DETAILED DESCRIPTION

Figure 1:
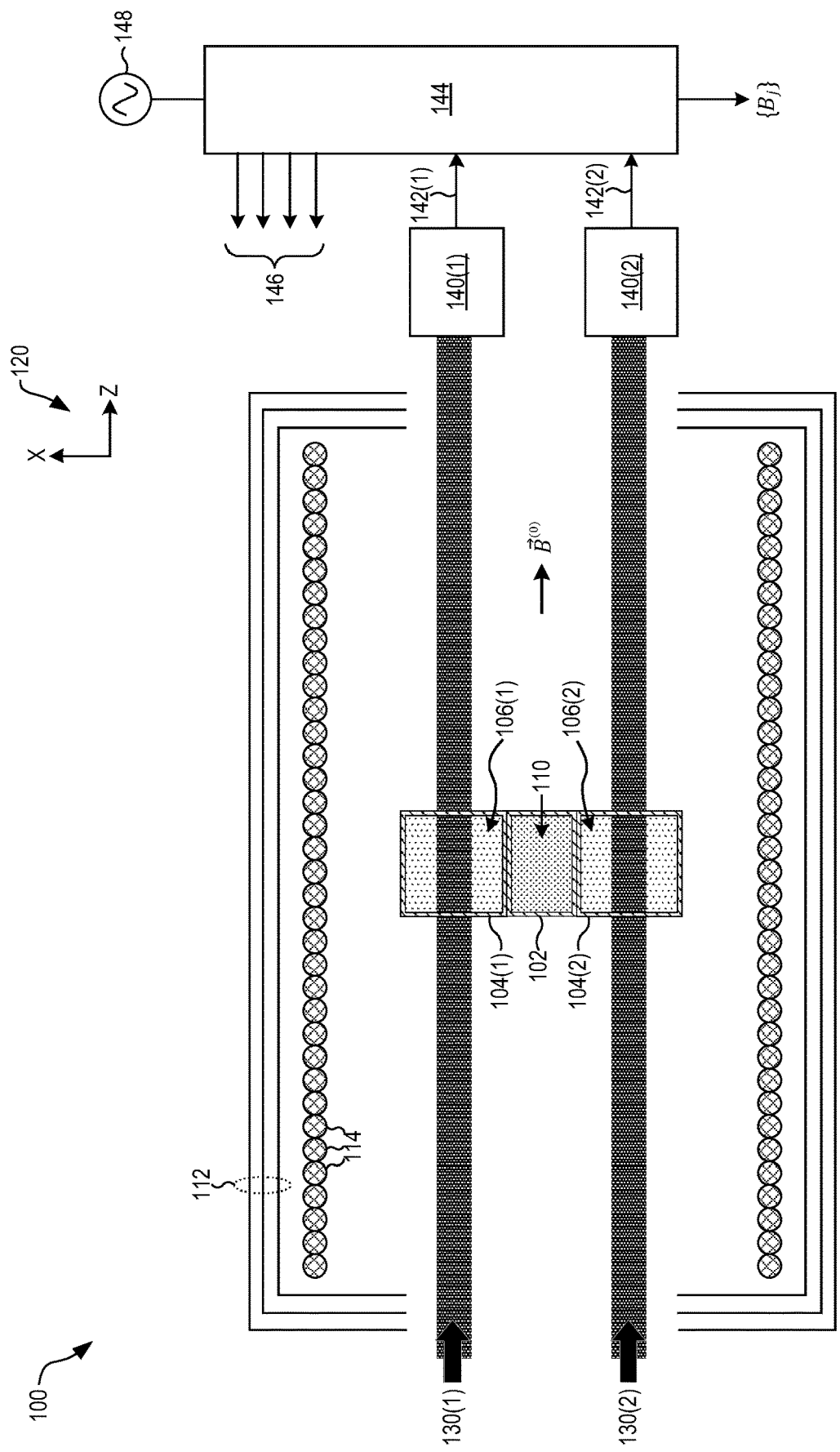
FIG. 1 is a top sectional view of a dual atomic magnetometer that measures magnetic fields generate by a sample, in an embodiment.
Figure 2:
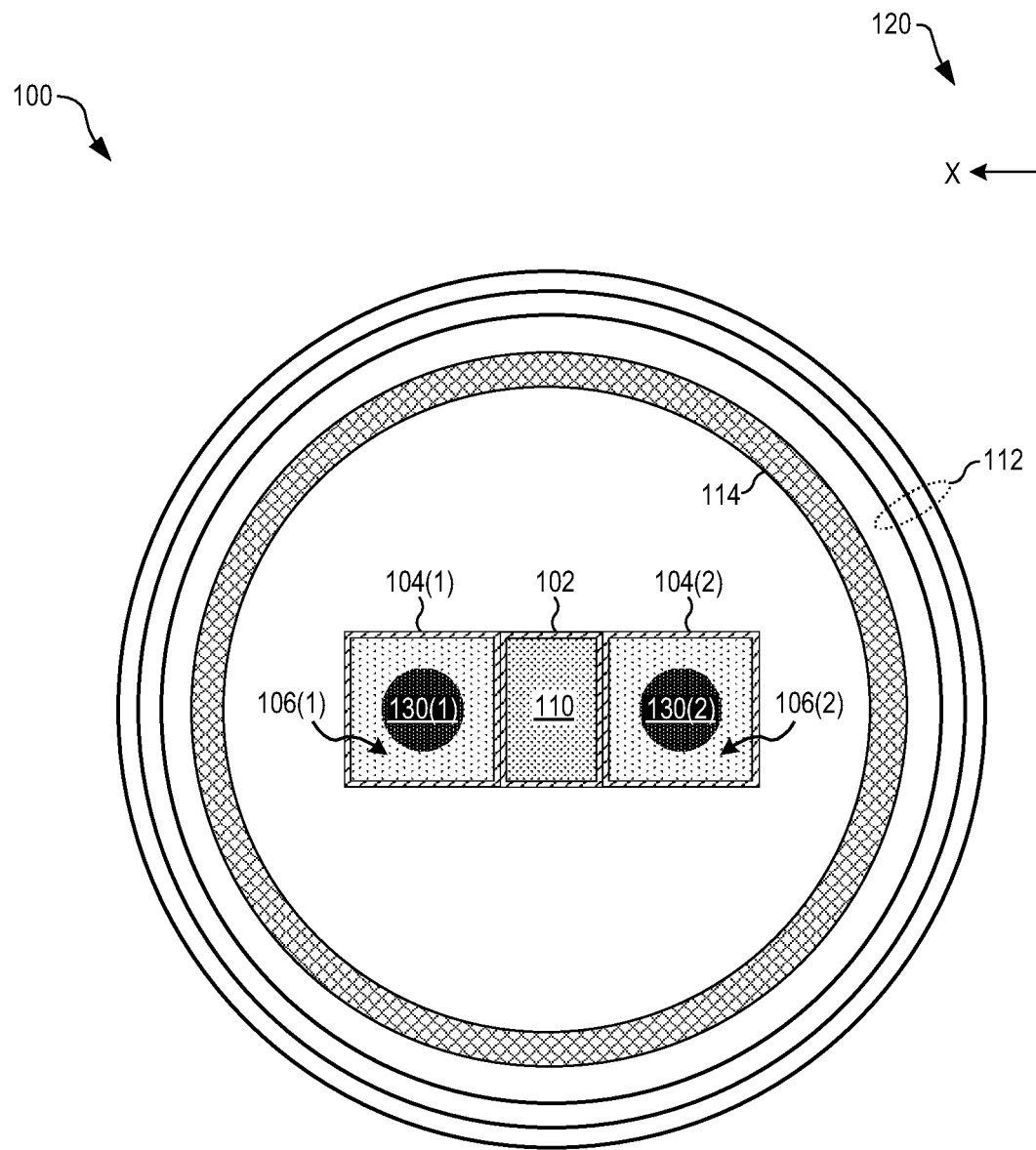
FIG. 2 is a side section view of the dual atomic magnetometer of FIG. 1.

FIGS. 1 and 2 are top and side sectional views of a dual atomic magnetometer 100 that measures magnetic fields generated by a sample 110. The dual atomic magnetometer 100 includes first and second vapor cells 104(1), 104(2) filled with first and second atomic vapors 106(1), 106(2), respectively. The sample 110 is placed inside a sample cell 102 that is located between the first and second vapor cells 104(1), 104(2) in the x direction (see the right-handed coordinate system 120). A first pump beam (e.g., see first pump beam 640(1) in FIG. 6) spin-polarizes the first atomic vapor 106(1) by optically pumping the atoms of the first atomic vapor 106(1) into one or more ground-state magnetic sublevels such that the atoms precess at a Larmor frequency. The spin-precessing atoms, in turn, rotate the polarization of a linearly polarized first probe beam 130(1) that passes through the first vapor cell 104(1). A first polarimeter 140(1)

measures the polarization of the first probe beam 130(1) after exiting the first vapor cell 104(1), outputting a first polarization signal 142(1).

Figure 6:
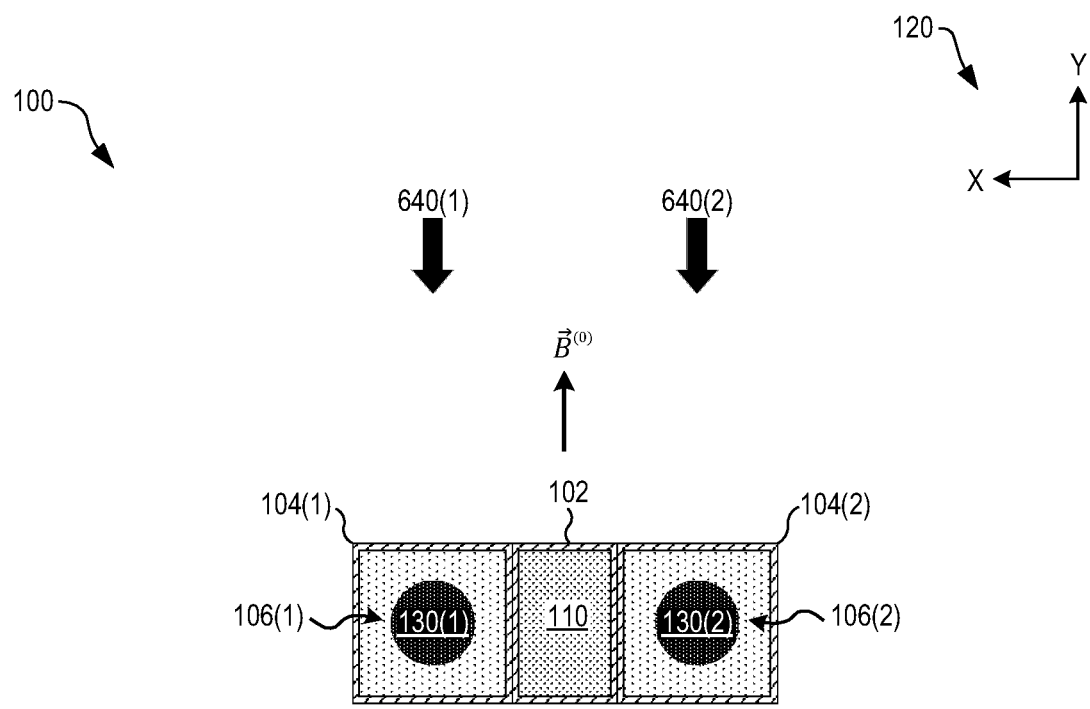
FIG. 6 is a side section view showing the dual atomic magnetometer of FIGS. 1 and 2 being used with a bias field oriented perpendicularly to the propagation direction of probe beams, in an embodiment.

Similarly, a second pump beam (e.g., see second pump beam 640(2) in FIG. 6) spin-polarizes the second atomic vapor 106(2) by optically pumping the atoms of the second atomic vapor 106(2) into one or more ground-state magnetic sublevels such that the atoms also precess at a Larmor frequency. These spin-polarized atoms rotate the polarization of a linearly polarized second probe beam 130(2) that passes through the second vapor cell 104(2). A second polarimeter 140(2) measures the polarization of the second probe beam 130(2) after exiting the second vapor cell 104(2), outputting a second polarization signal 142(2).

The polarization of the first probe beam 130(1) oscillates at an instantaneous Larmor frequency $f_L(t)$, assuming that magnetic field gradients are negligible (i.e., the atoms in the first atomic vapor 106(1) interacting with the first probe beam 130(1) are subjected to the same magnetic field). The instantaneous Larmor frequency $f_L(t)$ depends on the scalar magnitude of the magnetic field, which has two components: a time-varying signal field $\vec{B}^{(s)}(t)=(B_x^{(s)}(t), B_y^{(s)}(t), B_x^{(s)}(t))$ arising from the sample 110, and a constant (i.e., time-independent) bias field $\vec{B}^{(0)}=(B_x^{(0)}, B_y^{(0)}, B_z^{(0)})$. Thus, the instantaneous Larmor frequency $f_L(t)$ can be represented mathematically as $f_L(t)=\gamma|\vec{B}^{(s)}(t)+\vec{B}^{(0)}|/(2\pi)$, where $\gamma$ is the gyromagnetic ratio of the species of the first atomic vapor 106(1). Assuming $|\vec{B}^{(s)}(t)|<<|\vec{B}^{(0)}|$, the instantaneous Larmor frequency $f_L(t)$ is approximated by $f_L(t)\approx\gamma|\vec{B}^{(0)}|/(2\pi)$, which is time-independent. Therefore, the bias field $\vec{B}^{(0)}$ sets a nominal Larmor frequency $f_L^{(0)}\approx\gamma|\vec{B}^{(0)}|/(2\pi)$ that is subsequently modified by the signal field $\vec{B}^{(s)}(t)$. In FIGS. 1 and 2, the bias field $\vec{B}^{(0)}$ is oriented along the +z direction (i.e., $\vec{B}^{(0)}=(0, 0, B_z^{(0)})$), for which $f_L^{(0)}=\gamma_{Bz}^{(0)}/(2\pi)$. However, the bias field $\vec{B}^{(0)}$ may point in other directions, as discussed in more detail below. The same argument holds for the second probe beam 130(2) and the second atomic vapor 106(2). It is assumed herein that the bias field $\vec{B}^{(0)}$ is the same at both of the vapor cells 104(1) and 104(2) and the sample cell 102.

FIG. 1 also shows a signal processor 144 that implements time-multiplexed operation of the dual atomic magnetometer 100. The signal processor 144 is a circuit that acquires and processes the polarization signals 142(1) and 142(2) into a magnetic-field sequence $\{B_j\}$. Although not shown in FIG. 1, the signal processor 144 may include a computing device with a processor and a memory storing machine-readable instructions that, when executed by the processor, control the signal processor 144 to implement the functionality described herein. Alternatively, the signal processor 144 may be a chip or circuit (e.g., a field-programmable gate array) that has been previously programmed to implement the functionality described herein. When the polarization signals 142(1) and 142(2) are analog electronic signals, the signal processor 144 may include analog-to-digital converters that convert the polarization signals 142(1) and 142(2) into digital electronic signals that are subsequently processed. Alternatively, each of the polarimeters 140(1) and 140(2) may include an analog-to-digital converter, wherein the polarization signals 142(1) and 142(2) are received by the signal processor 144 as digital electronic signals. A reference oscillator 148 establishes common timing for data acquisition, time tagging, and laser-timing control. The signal processor 144 may output the magnetic-field sequence $\{B_j\}$ to data storage (e.g., a memory card or hard drive), a computer monitor or screen for display to a user, or another computer system (e.g., via Ethernet or Wi-Fi) for additional signal processing and storage.

In some embodiments, the signal processor 144 also serves as a controller that outputs one or more timing signals 146 that control when the first and second pump beams and the first and second probe beams 130(1), 130(2) pass through the vapor cells 104(1) and 104(2). For example, the timing signals 146 may be used to gate (i.e., turn on and off) each of the pump beams and probe beams 130(1), 130(2) by driving a corresponding acousto-optic modulator, electro-optic modulator, or mechanical shutter. The timing signals 146 may also be used to change the frequency of one or more of the pump beams and the probe beams 130(1), 130(2). In other embodiments, a controller separate from the signal processor 144 implements timing control of the first and second pump beams and the first and second probe beams 130(1), 130(2).

Figure 3:
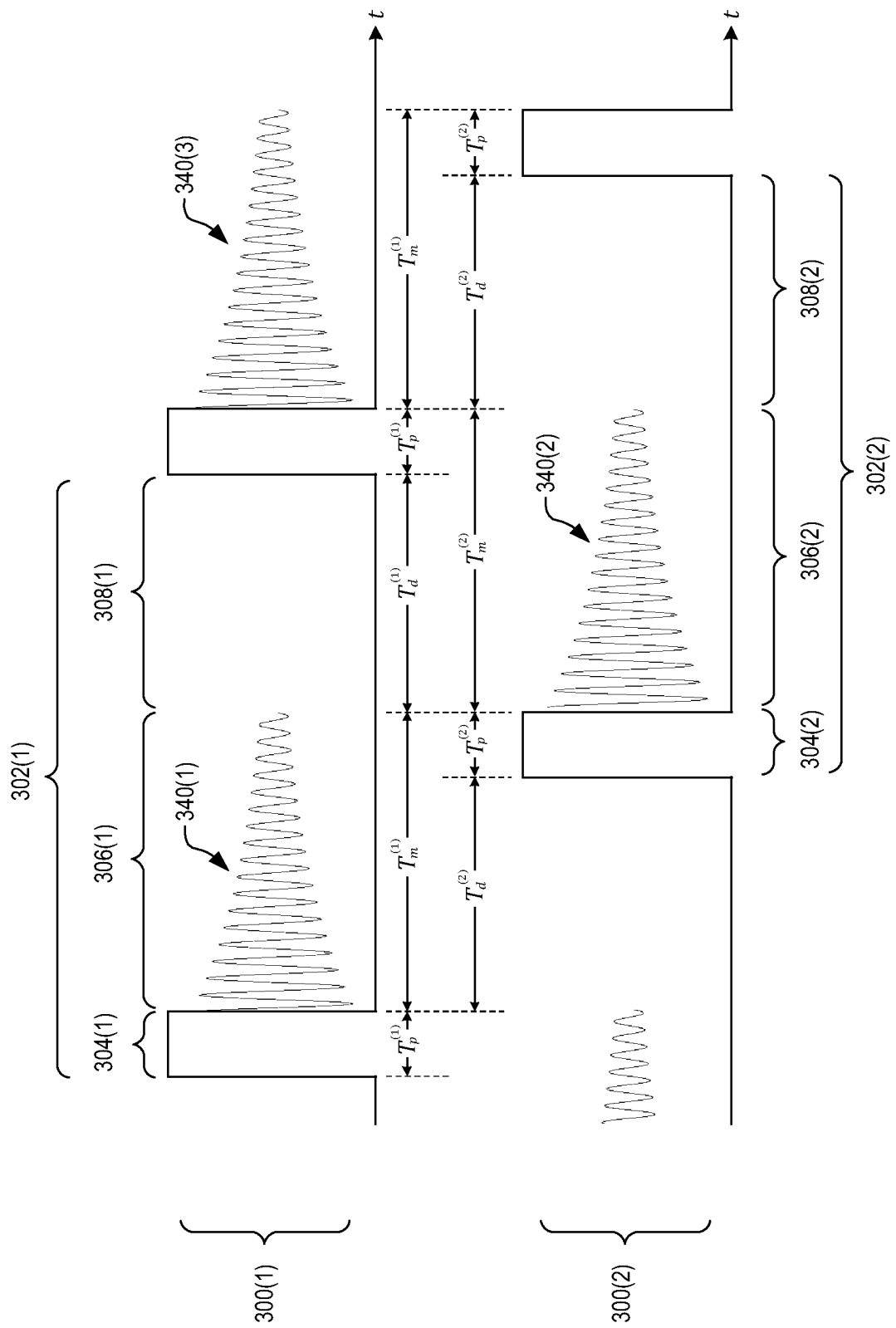
FIG. 3 shows first and sequence timing sequences that illustrate time-multiplexed operation of the dual atomic magnetometer of FIGS. 1 and 2, in an embodiment.

FIG. 3 shows first and second timing sequences 300(1), 300(2) that illustrate time-multiplexed operation of the dual atomic magnetometer 100 of FIGS. 1 and 2. The first timing sequence 300(1) corresponds to operation of the first vapor cell 104(1), the first probe beam 130(1), the first pump beam, and the first polarimeter 140(1). Similarly, the second timing sequence 300(2) corresponds to operation of the second vapor cell 104(2), the second probe beam 130(2), the second pump beam, and the second polarimeter 140(2).

The first timing sequence 300(1) is formed from a first repeating frame 302(1) that has: (i) a first pumping stage 304(1) with a first pumping duration $T_p^{(1)}$, (ii) a first measurement stage 306(1) with a first measurement duration $T_m^{(1)}$, and (iii) a first dead stage 308(1) with a first dead-time duration $T_d^{(1)}$. During the first pumping stage 304(1), the first probe beam 130(1) is blocked while the first pump beam spin-polarizes the first atomic vapor 106(1). During the first measurement stage 306(1), the first pump beam is blocked while the first probe beam 130(1) propagates through the first atomic vapor 106(1). The first polarimeter 140(1) measures the polarization of the first probe beam 130(1) to obtain a first data block 340(1) of the first polarization signal 142(1). During the first dead stage 308(1), no first polarization signal 142(1) is obtained (e.g., both the first probe beam 130(1) and the first pump beam are blocked, or the output of the first polarimeter 140(1) is ignored). The first timing sequence 300(1) is therefore periodic with a first period $T_1=T_p^{(1)}+T_m^{(1)}+T_d^{(1)}$, and has a measurement duty cycle $\eta_1=T_m^{(1)}/T_1$.

The second timing sequence 300(2) is similar to the first timing sequence 300(1) except that it is delayed with respect to the first timing sequence 300(1) by a second dead-time duration $T_d^{(2)}$ of a second dead stage 308(2). Specifically, the second timing sequence 300(2) is formed from a second repeating frame 302(2) that has: (i) a second pumping stage 304(2) with a second pumping duration $T_p^{(2)}$, (ii) a second measurement stage 306(2) with a second measurement duration $T_m^{(2)}$, and (iii) the second dead stage 308(2). During the second measurement stage 306(2), the first polarimeter 140(2) measures the polarization of the second probe beam 130(2) to obtain a second data block 340(2) of the second polarization signal 142(2). The second timing sequence 300(2) therefore is periodic with a second period $T_2=T_p^{(2)}+T_m^{(2)}+T_d^{(2)}$, and has a measurement duty cycle $\eta_2=T_m^{(2)}/T_2$.

The duration $T_d^{(2)}$ is selected such that the second pumping stage 304(2) ends when the first measurement stage 306(1) ends. This allows the second measurement stage 306(2) to begin immediately when the first measurement stage 306(1) ends, eliminating any gap between the data blocks 340(1) and 340(2). Similarly, the duration $T_d^{(1)}$ is selected such that the first pumping stage 304(1) ends when the second measurement stage 306(2) ends. This allows the first measurement stage 306(1) to resume immediately when the second measurement stage 306(2) ends, eliminating any gap between the second data block 340(2) and a subsequent third data block 340(3).

The polarization signal 142 within each data block 340 approximates an exponentially-decaying sine wave at the instantaneous Larmor frequency. The time constant of the exponential decay is determined by transverse spin relaxation of the atoms in the vapors 106. The vapor cells 104 may be filled with a buffer gas (e.g., $N_2$ or $^4He$) and/or lined with an anti-relaxation coating (e.g., paraffin) to reduce spin relaxation and increase the time constant. Dephasing times $T_2$ are typically between a fraction of a millisecond and several tens of milliseconds, depending on the geometry and size of the vapor cells 104, the pressures of the vapors 106 and buffer gas (when included), the choice of atomic species for the vapors 106 (e.g., Rb, Cs, K, Na, etc.), the choice of species for the buffer gas (when included), the type of anti-relaxation coating (when included), etc. The dephasing time $T_2$ is the primary determinant of the measurement durations $T_m^{(1)}$ and $T_m^{(2)}$, as the signal-to-noise ratio decays with $T_2$.

If general, the first and second measurement durations $T_m^{(1)}$, $T_m^{(2)}$ do not need to be equal. Similarly, the first and second pumping durations $T_p^{(1)}$, $T_p^{(2)}$ do not need to be equal. In some embodiments, the first and second measurement durations $T_m^{(1)}$, $T_m^{(2)}$ are equal, as shown in FIG. 3. In these embodiments, $T_d^{(1)}$, $T_d^{(2)}$, $T_m^{(1)}$, and $T_m^{(2)}$ are all similar. In some embodiments, the first and second pumping durations $T_p^{(1)}$, $T_p^{(2)}$ are similar.

Figure 4:
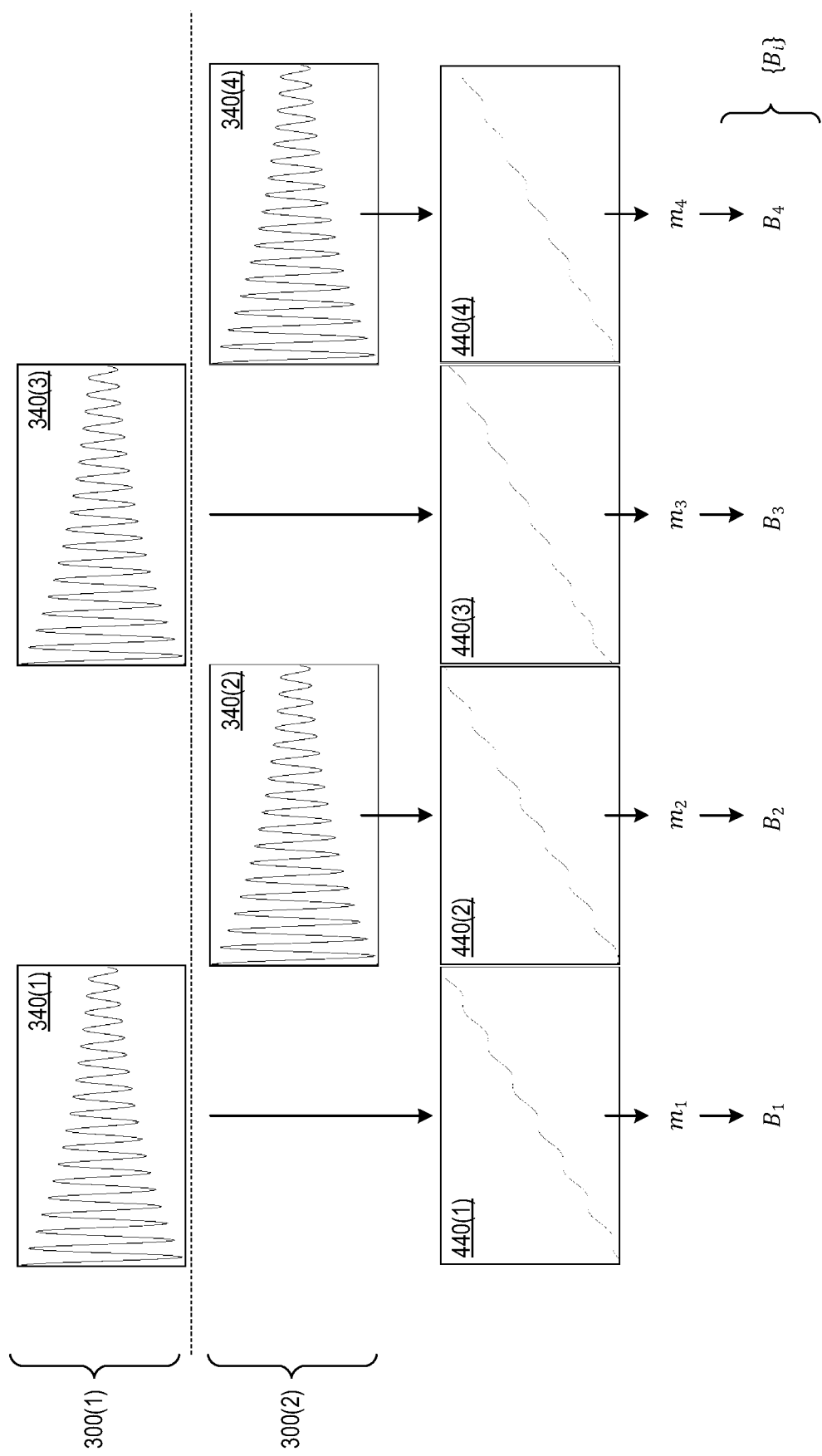
FIG. 4 shows how instantaneous-phase retrieval is implemented with each data block of FIG. 3 to obtain a corresponding instantaneous-phase block, in an embodiment.
Figure 5:
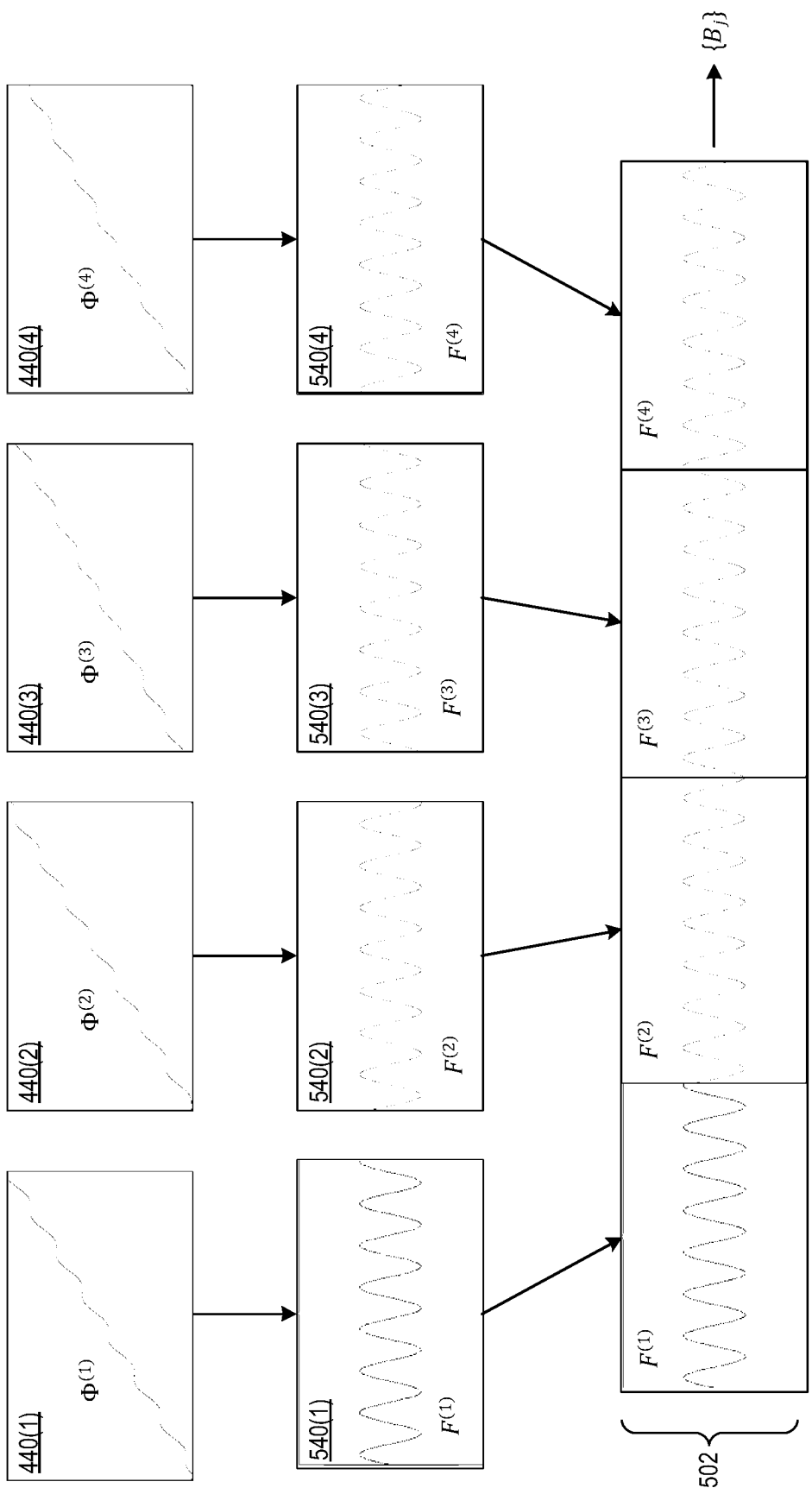
FIG. 5 shows how several consecutive frequency blocks may be concatenated into the single gapless temporal sequence, in an embodiment.

FIGS. 4 and 5 illustrate how an alternating sequence of the data blocks 340 can be processed to generate a single gapless temporal sequence 502 that represents the signal field $\vec{B}^{(s)}(t)$. In FIG. 4, instantaneous phase retrieval is implemented with each data block 340(i) to obtain a corresponding instantaneous-phase block 440(i). Details about instantaneous-phase retrieval can be found in "Wide-bandwidth atomic magnetometry via instantaneous-phase retrieval" by N. Wilson et al. (arXiv:2003.04526v1), which is incorporated herein by reference in its entirety. Specifically, the instantaneous phase $\phi_I^{(i)}(t)$ is obtained mathematically as the argument of an analytic phase $\phi_a^{(i)}(t)$:

$$\phi_I^{(i)}(t) = \arg(\phi_a^{(i)}(t)) = \arg(\varphi^{(i)}(t) + i\mathcal{H}\{\varphi^{(i)}(t)\}), \quad (1)$$

where $\varphi^{(i)}(t)$ is the measured polarization angle of the data block 340(i), and $\mathcal{H}\{\ \}$ indicates a Hilbert transform. In FIGS. 4 and 5, each phase block 440(i) shows $\phi_I^{(i)}(t)$ after unwrapping. The derivative of the instantaneous phase $\phi_I^{(i)}(t)$, after unwrapping, gives the instantaneous Larmor frequency for the data block 340(i):

$$f_L^{(i)}(t) = \frac{1}{2\pi} \frac{d\phi_I^{(i)}(t)}{dt}. \quad (2)$$

The magnetic field sensed by the atoms in the vapor 106 during the data block 340(i) is directly proportional to the instantaneous Larmor frequency $f_L^{(i)}(t)$, as described previously.

In some embodiments, and as shown in FIG. 4, the unwound instantaneous phase $\phi_I^{(i)}(t)$ of each instantaneous-phase block 440(i) is fit to a straight line (e.g., via linear regression) to obtain a corresponding slope mi that represents the average value of $d\phi_I^{(i)}(t)/dt$ (i.e., the average Larmor frequency) over the measurement duration $T_m^{(i)}$ of the corresponding data block 340(i). Dividing $m_i$ by the gyromagnetic ratio $\gamma$ gives a single corresponding magnetic-field value $B_i$. A sequence of several consecutive magnetic-field values $\{B_i\}$ can then be used to identify changes in the magnetic field between data blocks 340(i). For example, the Fourier transform of the sequence $\{B_i\}$ can be calculated to identify components of $\vec{B}^{(s)}(t)$ with frequencies less than the measurement duration $T_m$.

In some embodiments, and as shown in FIG. 5, the time-derivative of each phase block 440(i) is calculated to obtain a corresponding frequency block 540(i) that numerically represents the instantaneous Larmor frequency $f_L^{(i)}(t)$ of the phase block 440(i). For example, when each phase block 440(i) is represented as a temporal phase sequence of N instantaneous-phase values $\Phi^{(i)} = \{\phi_1, \phi_2, \ldots, \phi_N\}$ equally spaced in time by a point spacing $\Delta t$, then the corresponding frequency block 540(i) can be represented as a temporal frequency sequence of N−2 values $F^{(i)} = \{f_j = \phi_{j+1} - \phi_{j-1}/(2\Delta t)\}$ for j=2 to N−1. Other methods of numerical differentiation may be used to calculate the temporal frequency sequence from the temporal phase sequence (e.g., the method of finite difference coefficients) without departing from the scope hereof. Such methods may also be used to obtain frequencies points corresponding to $\phi_1$ and $\phi_N$ such that the frequency sequence $F^{(i)}$ and the phase sequence $\Phi^{(i)}$ have the same number of points, and the points are aligned in time.

As shown in FIG. 5, several consecutive frequency blocks 540(i) may be concatenated into the single gapless temporal sequence 502. Equivalently, each frequency block 540 may be sequentially appended to the temporal sequence 502 to extend the temporal sequence 502 in time. Each point of the temporal sequence 502 may then be divided by the gyromagnetic ratio $\gamma$ to obtain a magnetic-field sequence $\{B_j\}$ that approximates the time-varying total magnetic-field strength $|\vec{B}^{(s)}(t) + \vec{B}^{(0)}|$. The magnetic-field sequence $\{B_j\}$ may be subsequently analyzed (e.g., Fourier transform) to identify features associated with the sample 110.

In other embodiments, the instantaneous-phase blocks 440(i) are concatenated together to form the single gapless temporal sequence 502. The time derivative of the temporal sequence 502 may then be calculated, after which each point is divided by the gyromagnetic ratio $\gamma$ to obtain the magnetic-field sequence $\{B_j\}$. In these embodiments, concatenating before the time derivative may improve estimates of the instantaneous frequency at the boundaries of the phase blocks 440(i).

In the example of FIGS. 1 and 2, the dual atomic magnetometer 100 may also include a solenoid 114 to generate the bias field $\vec{B}^{(0)} = (0, 0, B_z^{(0)})$ along the propagation direction of the probe beams 130(1), 130(2). The vapor cells 104(1), 104(2) and sample 110 are located along an axis of the solenoid 114 where the homogeneity of the bias field $\vec{B}^{(0)}$ is greatest. The bias field $\vec{B}^{(0)} = (0, 0, B_z^{(0)})$ may be alternatively generated with one or other magnetic coils, such as a pair of Helmholtz coils. Furthermore, one or more layers of magnetic shielding 112 may surround the solenoid 114 (or other magnetic coils), the sample cell 102, and the vapor cells 104 to block external magnetic fields.

The instantaneous Larmor precession frequency $f_L(t)$ is given mathematically by $$f_L(t) = \frac{\gamma}{2\pi}\left|\vec{B}^{(s)}(t) + \vec{B}^{(0)}\right| = \tag{3}$$

$$\frac{\gamma}{2\pi}\sqrt{\left(B_x^{(0)} - B_x^{(s)}(t)\right)^2 + \left(B_y^{(0)} - B_y^{(s)}(t)\right)^2 + \left(B_z^{(0)} - B_z^{(s)}(t)\right)^2}.$$

For $B_x^{(0)} = B_y^{(0)} = 0$, Eqn. 3 simplifies to $$f_L(t) = \frac{\gamma}{2\pi}B_z^{(0)}\sqrt{1 + \frac{\left|\vec{B}^{(s)}(t)\right|^2}{\left(B_z^{(0)}\right)^2} - 2\frac{B_z^{(s)}(t)}{B_z^{(0)}}} \approx \frac{\gamma}{2\pi}B_z^{(0)}\left(1 - \frac{B_z^{(s)}(t)}{B_z^{(0)}} + \ldots\right), \tag{4}$$

where the Taylor expansion in Eqn. 4 assumes $|\vec{B}^{(s)}(t)| \ll B_z^{(0)}$. Eqn. 4 shows that $f_L(t)$ approximately equals the nominal Larmor frequency $f_L^{(0)} \approx \gamma B_z^{(0)}/(2\pi)$, but is modulated primarily (i.e., to first order) by the z-component $B_z^{(0)}(t)$ of the signal field $\vec{B}^{(s)}(t)$. Equivalently, $B_x^{(s)}(t)$ and $B_y^{(s)}(t)$ only modulate the instantaneous Larmor frequency $f_L(t)$ to second order in the Taylor expansion, and are therefore suppressed relative to $B_z^{(s)}(t)$. Accordingly, the setup shown in FIGS. 1 and 2 preferentially measures the z component $B_z^{(s)}(t)$ of the signal field $\vec{B}^{(s)}(t)$.

FIG. 6 is a side section view of the dual atomic magnetometer 100 of FIGS. 1 and 2 being used with a bias field $\vec{B}^{(0)}$ oriented perpendicularly to the propagation direction of the probe beams 130(1) and 130(2). Specifically, the bias field $\vec{B}^{(0)}$ points in the +y direction, i.e., $\vec{B}^{(0)} = (0, B_y^{(0)}, 0)$. The instantaneous Larmor precession frequency $f_L(t)$ is given mathematically by $$f_L(t) = \frac{\gamma}{2\pi}B_y^{(0)}\sqrt{1 + \frac{\left|\vec{B}^{(s)}(t)\right|^2}{\left(B_y^{(0)}\right)^2} - 2\frac{B_y^{(s)}(t)}{B_y^{(0)}}} \approx \frac{\gamma}{2\pi}B_y^{(0)}\left(1 - \frac{B_y^{(s)}(t)}{B_y^{(0)}} + \ldots\right). \tag{5}$$

Now, $B_x^{(s)}(t)$ and $B_z^{(s)}(t)$ only modulate the instantaneous Larmor frequency $f_L(t)$ to second order in the Taylor expansion, and are therefore suppressed relative to $B_y^{(s)}(t)$. Accordingly, the setup shown in FIG. 6 preferentially measures the y component $B_y^{(s)}(t)$ of the signal field $\vec{B}^{(s)}(t)$. Similar calculations show that when the bias field $\vec{B}^{(0)}$ points in the x direction, $B_y^{(s)}(t)$ and $B_z^{(s)}(t)$ only modulate the instantaneous Larmor frequency $f_L(t)$ to second order, and are therefore suppressed. Thus, the dual atomic magnetometer 100 can be used to preferentially measure a component of the signal field $\vec{B}^{(s)}(t)$ by aligning the bias field $\vec{B}^{(0)}$ along the direction of the component.

Figure 7:
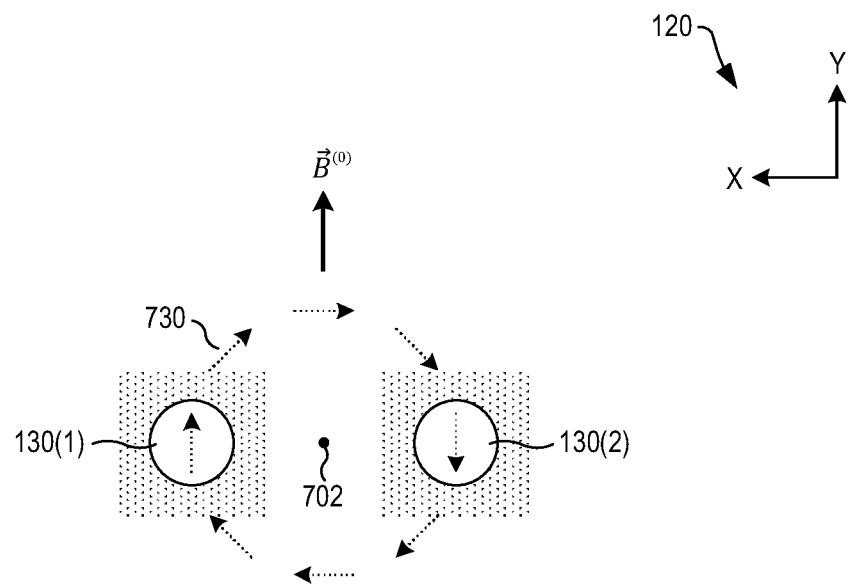
FIG. 7 is a side sectional view of components of the dual atomic magnetometer of FIGS. 1 and 2 in which a charge moves along the +z direction within a bias field oriented in the +y direction.

FIG. 7 is a side sectional view of components of the dual atomic magnetometer 100 of FIGS. 1 and 2 in which a charge 702 moves along the +z direction within a bias field $\vec{B}^{(0)}$ oriented in the +y direction. For clarity in FIG. 7, the sample cell 102 and vapor cells 104(1) and 104(2) are not shown. Due to its motion, the charge 702 generates a magnetic field 730 that circles in the x-y plane. At the first probe beam 130(1), the magnetic field 730 adds to the bias field $\vec{B}^{(0)}$, causing the atoms probed by the first probe beam 130(1) to precess at a Larmor frequency greater than $\gamma|\vec{B}^{(0)}|$.

At the at the second probe beam 130(2), the magnetic field 730 subtracts from the bias field $\vec{B}^{(0)}$, causing the atoms probed by the second probe beam 130(2) to precess at a Larmor frequency less than $\gamma|\vec{B}^{(0)}|$. Thus, due to the magnetic field 730, atoms probed by the probe beams 130(1) and 130(2) precess at different rates. In this case, the data blocks 340 cannot be concatenated into the single gapless temporal sequence 502 since the Larmor frequency shifts with each data block 340.

Figure 8:
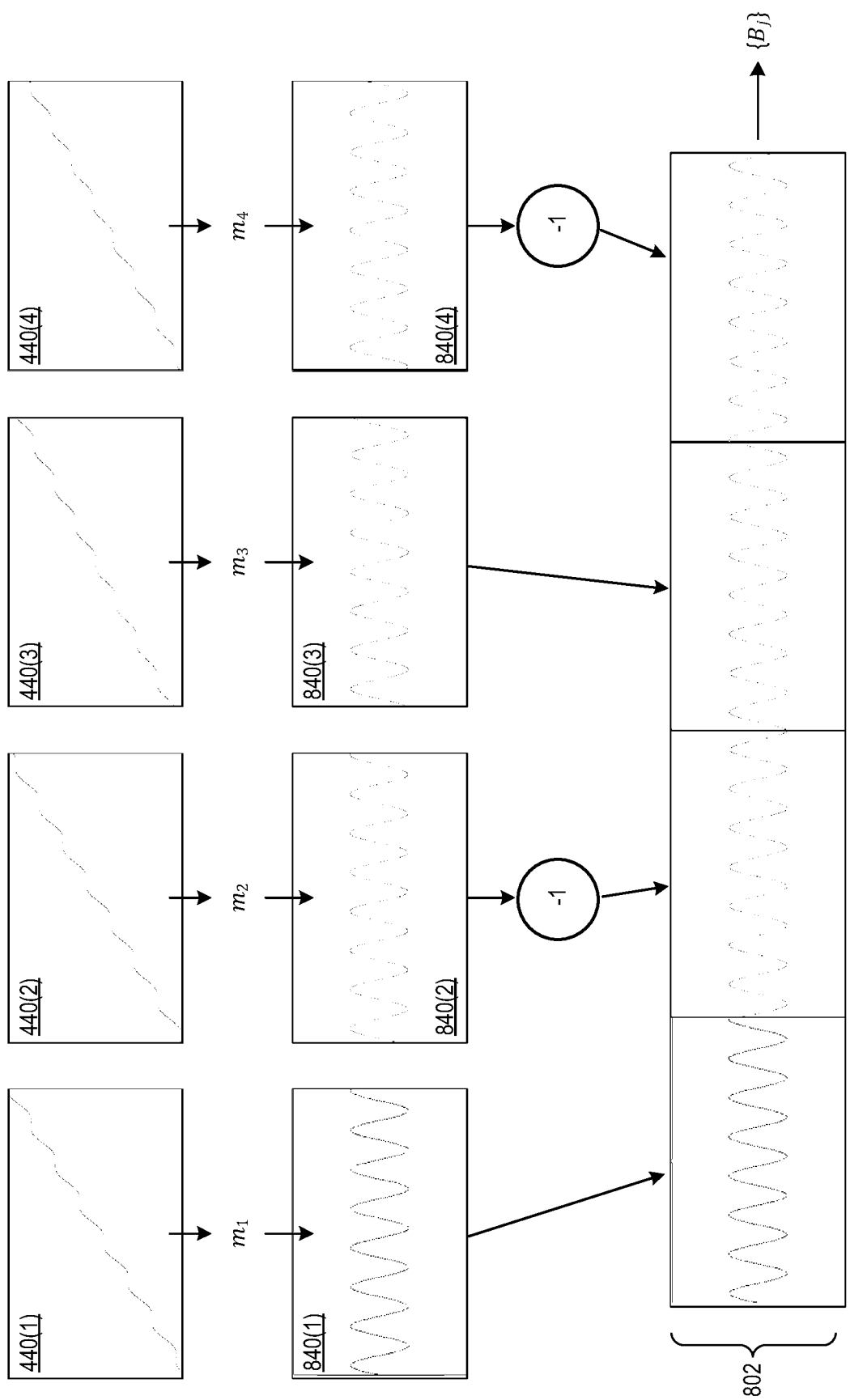
FIG. 8 illustrates how an alternating sequence of the data blocks can be processed to generate a single gapless temporal sequence for the scenario depicted in FIG. 7, in an embodiment.

FIG. 8 illustrates how the alternating sequence of the data blocks 340 can be processed to generate a single gapless temporal sequence 802 for the scenario depicted in FIG. 7. Here, each data block 340(i) is processed into a corresponding instantaneous-phase block 440(i), as described above (not shown in FIG. 8). Each phase block 440(i) is then fit to a straight line to obtain a corresponding best-fit slope $m_i$, also as described before and shown in FIG. 8. The best-fit slope $m_i$ is then used to obtain a corresponding residual block 840(i) of the phase block 440(i), which approximates the signal field $\vec{B}^{(s)}(t)$ without the static bias field $\vec{B}^{(0)}$. For the data blocks 340 obtained from the second vapor cell 104(2) (e.g., data blocks 340(l), where l is even), the corresponding residual blocks 840 are inverted to account for the different directions of the magnetic field 730 relative to the bias field $\vec{B}^{(0)}$. Here, "inverted" means that the value of each point in the residual block 840 is multiplied by −1, as represented in FIG. 8 by a circle with "−1" inscribed therein. The inverted residual blocks 840 are then be interleaved with the uninverted residual blocks 840 obtained from the first vapor cell 104(1) (e.g., data blocks 340(l), where l is odd) to form the single gapless temporal sequence 802. The time-derivative of the temporal sequence 802 is then calculated to obtain a corresponding frequency sequence, which is then divided by γ to obtain the magnetic-field sequence $\{B_j\}$.

Optical pumping of the vapors 106(1) and 106(2) may be implemented using a technique known in the art. For example, when the bias field $\vec{B}^{(0)}$ is parallel to the propagation direction of the probe beams 130(1) and 130(2) (e.g., the z direction in FIGS. 1 and 2), linearly polarized first and second pump beams may be directed through the respective vapor cells 104(1) and 104(2) parallel to the probe beams 130(1) and 130(2) to pump the atoms into a dark superposition of ground-state magnetic sublevels (i.e., coherent population trapping). The resulting ground-state coherence between these magnetic sublevels varies in time, and is equivalent to a precession of the atoms in the reference frame of the probe beams 130(1) and 130(2). Alternatively, the pump beams may be oriented perpendicularly to the probe beams 130(1) and 130(2). For example, in FIG. 6 circularly polarized pump beams 640(1) and 640(2) may be directed through the respective vapor cells 104(1) and 104(2) parallel to the bias field $\vec{B}^{(0)}$ to optically pump the atoms into a stretched state that precesses along the z direction in the reference frame of the probe beams 130(1) and 130(2). Another optical pumping technique known in the art may be used without departing from the scope hereof.

In some embodiments, more than two vapor cells 104 are placed around the sample cell 102. For example, in the dual atomic magnetometer 100 shown in FIG. 2, third and fourth vapor cells 104 may be placed above and below the sample cell 102 (in the y direction). In these embodiments, four polarization signals can be processed and interleaved, as described above, to form the single gapless temporal sequence 802 and the magnetic-field sequence {B$_j$}. Furthermore, while FIGS. 1 and 2 show the vapor cells 104(1) and 104(2) located on opposite sides of the sample cell 102 (along the x direction), the vapor cells 104(1) and 104(2) may be positioned otherwise without departing from the scope hereof. For example, the vapor cells 104(1) and 104(2) may be positioned proximate to adjacent perpendicular side faces of the sample cell 102.

Some embodiments include only the signal processor 144, wherein all other components (e.g., the vapor cells 104(1) and 104(2), the sample cell 102, the polarimeters 140(1) and 140(2), etc.) are provided by a third party. Other embodiments exclude the signal processor, 144, which is provided by a third party.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A time-multiplexed dual atomic magnetometer, comprising:
   first and second vapor cells positioned such that an external magnetic field induces Larmor precession of atoms confined within the first and second vapor cells;
   a first polarimeter configured to measure a first polarization of a first probe beam after the first probe beam propagates through the first vapor cell;
   a second polarimeter configured to measure a second polarization of a second probe beam after the second probe beam propagates through the second vapor cell; and
   a controller configured to gate the first and second probe beams such that:
      the first probe beam propagates through the first vapor cell during a first measurement stage, the first measurement stage beginning when a second measurement stage ends, the second measurement stage beginning when the first measurement stage ends;
      the second probe beam does not propagate through the second vapor cell during the first measurement stage;
      the second probe beam propagates through the second vapor cell during the second measurement stage; and
      the first probe beam does not propagate through the first vapor cell during the second measurement stage.

2. The time-multiplexed dual atomic magnetometer of claim 1, wherein:
   the first measurement stage has a first duration; and
   the second measurement stage has a second duration that is the same as the first duration.

3. The time-multiplexed dual atomic magnetometer of claim 1, wherein:
   the first measurement stage has a first duration; and
   the second measurement stage has a second duration that is different than the first duration.

4. The time-multiplexed dual atomic magnetometer of claim 1, wherein the controller is configured to gate a first pump beam and a second pump beam such that:
   the first pump beam only propagates through the first vapor cell during a first pumping stage prior to the first measurement stage, the first pump beam spin-polarizing the atoms in the first vapor cell; and
   the second pump beam only propagates through the second vapor cell during a second pumping stage prior to the second measurement stage, the second pump beam spin-polarizing the atoms in the second vapor cell.

5. The time-multiplexed dual atomic magnetometer of claim 4, wherein:
   the first pumping stage has a first duration; and
   the second pumping stage has a second duration that is the same as the first duration.

6. The time-multiplexed dual atomic magnetometer of claim 4, wherein:
   the first pumping stage has a first duration; and
   the second pumping stage has a second duration that is different than the first duration.

7. The time-multiplexed dual atomic magnetometer of claim 1, further comprising at least one magnetic field coil configured to apply a magnetic bias field to the first and second vapor cells.

8. The time-multiplexed dual atomic magnetometer of claim 7, wherein:
   the first and second probe beams propagate along a common propagation direction; and
   the at least one magnetic field coil is positioned such that the magnetic bias field is parallel to the common propagation direction.

9. The time-multiplexed dual atomic magnetometer of claim 7, wherein:
   the first and second probe beams propagate along a common propagation direction; and
   the at least one magnetic field coil is positioned such that the magnetic bias field is perpendicular to the common propagation direction.

10. The time-multiplexed dual atomic magnetometer of claim 1, further comprising a sample cell shaped to confine a sample therein, the sample generating the external magnetic field.

11. A method for time-multiplexed dual atomic magnetometry, comprising:
   inducing, with an external magnetic field, Larmor precession of atoms that are confined within first and second vapor cells;
   measuring, with a first polarimeter, a first polarization of a first probe beam after the first probe beam propagates through the first vapor cell;
   measuring, with a second polarimeter, a second polarization of a second probe beam after the second probe beam propagates through the second vapor cell; and
   gating the first and second probe beams such that:
      the first probe beam propagates through the first vapor cell during a first measurement stage, the first measurement stage beginning when a second measurement stage ends, the second measurement stage beginning when the first measurement stage ends;
      the second probe beam does not propagate through the second vapor cell during the first measurement stage;
      the second probe beam propagates through the second vapor cell during the second measurement stage; and
      the first probe beam does not propagate through the first vapor cell during the second measurement stage.

12. The method of claim 11, wherein said gating the first and second probe beams includes gating the first and second probe beams such the first measurement stage has a first duration and the second measurement stage has a second duration that is the same as the first duration.

13. The method of claim 11, wherein said gating the first and second probe beams includes gating the first and second probe beams such that the first measurement stage has a first duration and the second measurement stage has a second duration that is different than the first duration.

14. The method of claim 11, further comprising gating a first pump beam and a second pump beam such that:
- the first pump beam only propagates through the first vapor cell during a first pumping stage prior to the first measurement stage, the first pump beam spin-polarizing the atoms in the first vapor cell; and
- the second pump beam only propagates through the second vapor cell during a second pumping stage prior to the second measurement stage, the second pump beam spin-polarizing the atoms in the second vapor cell.

15. The method of claim 14, wherein said gating the first and second pump beams includes gating the first and second pump beams such that the first pumping stage has a first duration and the second pumping stage has a second duration that is the same as the first duration.

16. The method of claim 14, wherein said gating the first and second pump beams includes gating the first and second pump beams such that the first pumping stage has a first duration and the second pumping stage has a second duration that is different than the first duration.

17. The method of claim 11, further comprising applying a magnetic bias field to the first and second vapor cells.

18. The method of claim 17, wherein said applying includes applying the magnetic bias field such that a direction of the magnetic bias field is parallel to a common propagation direction of the first and second probe beams.

19. The method of claim 17, wherein said applying includes applying the magnetic bias field such that a direction of the magnetic bias field is perpendicular to a common propagation direction of the first and second probe beams.

20. The method of claim 11, further comprising placing a sample cell adjacent to the first and second vapor cells, the sample cell containing a sample that generates the external magnetic field.

* * * * *